US012810948B2

(12) United States Patent
Jain et al.

(10) Patent No.: US 12,810,948 B2
(45) Date of Patent: Nov. 24, 2026

(54) METHODS, SYSTEMS, AND APPARATUSES FOR READING NON-VOLATILE MEMORIES

(71) Applicant: STMicroelectronics International N.V., Geneva (CH)

(72) Inventors: Abhishek Jain, Noida (IN); Aditya Vasisth, Gurgaon (IN)

(73) Assignee: STMicroelectronics International N.V., Geneva (CH)

( * ) Notice: Subject to any disclaimer, the term of this patent is extended or adjusted under 35 U.S.C. 154(b) by 141 days.

(21) Appl. No.: 18/821,340

(22) Filed: Aug. 30, 2024

(65) Prior Publication Data

US 2025/0095750 A1 Mar. 20, 2025

Related U.S. Application Data

(60) Provisional application No. 63/582,980, filed on Sep. 15, 2023.

(51) Int. Cl.
*G11C 16/28* (2006.01)
*G11C 16/24* (2006.01)

(52) U.S. Cl.
CPC .............. *G11C 16/28* (2013.01); *G11C 16/24* (2013.01)

(58) Field of Classification Search
CPC ................................ G11C 16/28; G11C 16/24
See application file for complete search history.

(56) References Cited

U.S. PATENT DOCUMENTS 8,995,200 B1 3/2015 Mu et al.
2004/0062072 A1* 4/2004 Tanzawa ............. G11C 11/5642 365/145
2005/0190601 A1 9/2005 Yeh et al.
2006/0158947 A1 7/2006 Chan et al.
2006/0274576 A1* 12/2006 Redaelli ............. G11C 16/3436 365/185.2
2012/0230109 A1* 9/2012 Tsai ................... G11C 16/0483 365/185.18
2023/0386601 A1* 11/2023 Hwang ................ G11C 29/802

* cited by examiner

*Primary Examiner* — Min Huang
(74) *Attorney, Agent, or Firm* — Alston & Bird LLP

(57) ABSTRACT

Various examples in accordance with the present disclosure provide example methods, systems, and apparatuses for reading non-volatile memories.

17 Claims, 5 Drawing Sheets

| CONDITION | D0 | D1 | D2 | FINAL DOUT |
| --- | --- | --- | --- | --- |
| Icell>Iref1>Iref2>Iref3 | 0 | 0 | 0 | 0 |
| Iref 1 >Icell>Iref2 | 1 | 0 | 0 | 0 |
| Iref1>Iref2>Icell>Iref3 | 1 | 1 | 0 | 0 |
| Iref1>Iref2>Iref3>Icell | 1 | 1 | 1 | 1 |

304 306 308 310

322 324 326 328

FIG. 3

METHODS, SYSTEMS, AND APPARATUSES FOR READING NON-VOLATILE MEMORIES

CROSS REFERENCE TO RELATED APPLICATIONS

This application claims priority to U.S. Provisional Patent Application No. 63/582,980 filed on Sep. 15, 2023, which is incorporated herein by reference in its entirety.

FIELD OF THE INVENTION

Example embodiments of the present disclosure relate to reading semiconductor memory and, more particularly, to methods, systems, and apparatuses for reading non-volatile memories, such as multi-time programmable (eMTP) memories.

BACKGROUND

Applicant has identified many technical challenges and difficulties associated with reading semiconductor memories. Through applied effort, ingenuity, and innovation, Applicant has solved many of these identified problems by developing the embodiments of the present disclosure, which are described in detail below.

BRIEF SUMMARY

Various embodiments described herein related to methods, apparatuses, and systems for reading non-volatile memories is provided.

In accordance with one aspect of the present disclosure, a method for reading a memory cell is provided. In some embodiments, the method includes receiving a cell current of a memory cell; receiving a first reference current, a second reference current, and a third reference current; generating a first comparison output signal based on comparing the cell current to the first reference current; generating a second comparison output signal based on a comparing the cell current to the second reference current; generating a third comparison output signal based on comparing the cell current to the third reference current; and determining a granular state of the memory cell based at least in part on one or more of the comparison of the cell current to the first reference current, the comparison of the cell current to the second reference current, or comparison of the cell current to the third reference current.

In some embodiments, the first reference current corresponds to a minimum erased cell current based on a voltage threshold distribution associated with the memory cell.

In some embodiments, the second reference current corresponds to a maximum virgin cell current based on the voltage threshold distribution associated with the memory cell.

In some embodiments, the third reference current corresponds to a minimum virgin cell current based on the voltage threshold distribution associated with the memory cell.

In some embodiments, the memory cell is determined to be properly erased if the cell current is determined to be greater than the first reference current.

In some embodiments, the memory cell is determined to be under erased if the cell current is greater than the second reference current, and the first reference current is greater than the cell current.

In some embodiments, the memory cell is determined to be poorly erased if the cell current is greater than the third reference current, and each of the first reference current and the second reference current are greater than the cell current.

In some embodiments, the memory cell is determined to be programmed if the cell current is less than each of the first reference current, the second reference current, and the third reference current.

In some embodiments, the method further includes generating a final output signal corresponding to a primary state of the memory cell based on one or more of the first comparison output signal, the second comparison output signal, or the third comparison output signal.

In some embodiments, the method further includes outputting one or more of the first comparison output signal, the second comparison output signal, the third comparison output signal, or the final output signal.

In accordance with one aspect of the present disclosure, a robust read circuitry for reading a memory cell is provided. In some embodiments, the robust read circuitry includes a sense amplifier comprising. The sense amplifier may include one or more current generators configured to generate a plurality of reference currents; a comparator coupled to the one or more current generators, wherein the comparator is configured to receive a cell current of a memory cell; receive the plurality of reference currents; and determine a granular state of the memory cell based on comparing the cell current to at least two of the plurality of reference currents.

In some embodiments, the plurality of reference currents includes a first reference current corresponding to a minimum erased cell current based on a voltage threshold distribution associated with the memory cell; a second reference current corresponds to a maximum virgin cell current based on the voltage threshold distribution associated with the memory cell; and a third reference current corresponds to a minimum virgin cell current based on the voltage threshold distribution associated with the memory cell.

In some embodiments, the sense amplifier is configured to determine that the memory cell is properly erased if the cell current is determined to be greater than the first reference current.

In some embodiments, the sense amplifier is configured to determine that the memory cell is under erased if the cell current is determined to be greater than the second reference current, and the first reference current is determined to be greater than the cell current.

In some embodiments, the sense amplifier is configured to determine that the memory cell is poorly erased if the cell current is determined to be greater than the third reference current, and each of the first reference current and the second reference current are determined to be greater than the cell current.

In some embodiments, the sense amplifier is configured to determine that the memory cell is programmed if the cell current is determined to be less than the first reference current, the second reference current, and the third reference current.

In some embodiments, the robust read circuitry is further configured to output a primary state of the memory cell.

In some embodiments, the sense amplifier is a single ended sense amplifier.

In some embodiments, the memory cell is a two-level memory cell that is electrically programmable and erasable.

In some embodiments, the sense amplifier further includes a biasing circuit configured to bias a bit line associated with a memory cell.

The foregoing illustrative summary, as well as other exemplary objectives and/or advantages of the disclosure, and the manner in which the same are accomplished, are further explained in the following detailed description and its accompanying drawings.

BRIEF DESCRIPTION OF THE DRAWINGS

The description of the illustrative embodiments may be read in conjunction with the accompanying figures. It will be appreciated that, for simplicity and clarity of illustration, elements illustrated in the figures have not necessarily been drawn to scale, unless described otherwise. For example, the dimensions of some of the elements may be exaggerated relative to other elements, unless described otherwise. Embodiments incorporating teachings of the present disclosure are shown and described with respect to the figures presented herein, in which:

FIG. 3 illustrates an example output configuration of a logic stage of a robust read circuitry in accordance with at least one embodiment of the present disclosure.

DETAILED DESCRIPTION OF THE INVENTION

Figure 1:
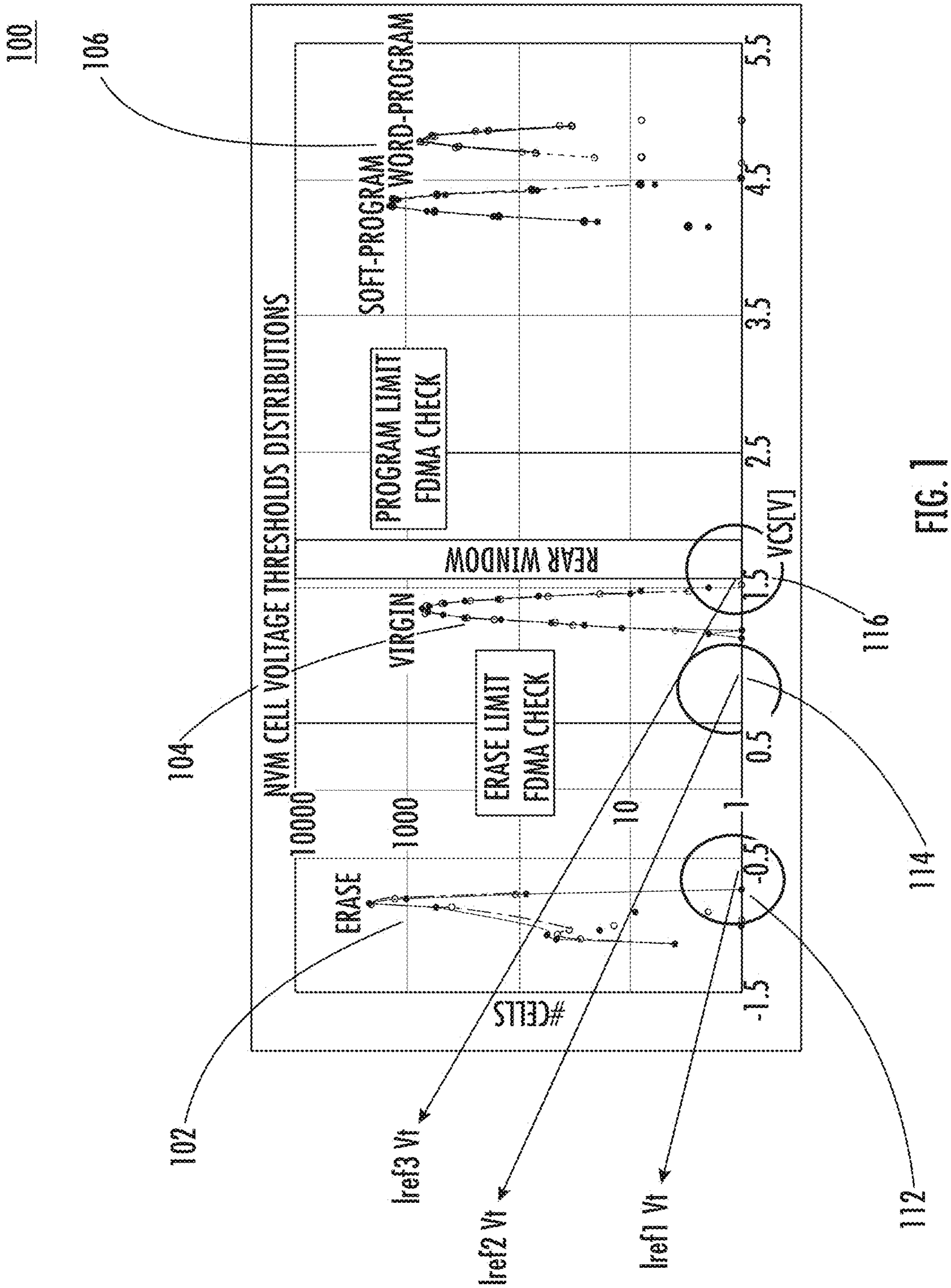
FIG. 1 illustrates example memory cell voltage threshold distribution set in accordance with at least one embodiment of the present disclosure.

Some embodiments of the present disclosure will now be described more fully hereinafter with reference to the accompanying drawings, in which some, but not all embodiments of the disclosure are shown. Indeed, these disclosures may be embodied in many different forms and should not be construed as limited to the embodiments set forth herein; rather, these embodiments are provided so that this disclosure will satisfy applicable legal requirements. Like numbers refer to like elements throughout.

Terms such as "computing," "determining," "generating," and/or similar words are used herein interchangeably to refer to the creation, modification, or identification of data. Further, "based on," "based on in part on," "based at least on," "based upon," and/or similar words are used herein interchangeably in an open-ended manner such that they do not indicate being based only on or based solely on the referenced element or elements unless so indicated. Like numbers refer to like elements throughout.

As used herein, terms such as "front," "rear," "top," etc. are used for explanatory purposes in the examples provided below to describe the relative position of certain components or portions of components. Furthermore, as would be evident to one of ordinary skill in the art in light of the present disclosure, the terms "substantially" and "approximately" indicate that the referenced element or associated description is accurate to within applicable engineering tolerances.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in one embodiment," "according to one embodiment," and the like generally mean that the particular feature, structure, or characteristic following the phrase may be included in at least one embodiment of the present disclosure, and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such a component or feature may be optionally included in some embodiments, or it may be excluded.

As used herein, the term "or" is used in both the alternative and conjunctive sense, unless otherwise indicated. The terms "illustrative" and "example" are used to be examples with no indication of quality level. Terms such as "computing," "determining," "generating," and/or similar words are used herein interchangeably to refer to the creation, modification, or identification of data. Further, "based on," "based on in part on," "based at least on," "based upon," and/or similar words are used herein interchangeably in an open-ended manner such that they do not indicate being based only on or based solely on the referenced element or elements unless so indicated. Like numbers refer to like elements throughout.

Semiconductor memories are commonly used in several applications for storing information, temporarily or permanently, in memory cells. Volatile memory devices, for example, may be configured to store information in memory cells temporarily. Non-volatile memory devices may be configured to store information in memory cells permanently in that stored information is preserved in the absence of power supply (e.g., when power supply is disconnected).

A non-volatile memory may include an array of memory cells (e.g., memory array) arranged in rows and columns to form a matrix, where the rows represent word lines, and the columns represent bit lines. Each memory cell may be configured for storing bits of information. In semiconductor memories, such as flash memories, the memory cells in the memory array may include transistors. For example, in a flash memory (e.g., integrated into a chip of a semiconductor material), each memory cell may consist of a floating-gate MOSFET configured to store one bit of information. In the memory array, word lines may connect gate terminals to memory cells on the same row, and bit lines may connect drain terminals of cells on the same column.

Each memory cell may have a voltage threshold associated with a corresponding logical value. The voltage threshold of a memory cell may depend on the amount of electrical charge trapped inside the floating gate of the memory cell. A read operation, program operation, and/or erase operation may be performed on a memory cell. To program a memory cell, for example, a high voltage may be applied to the drain of the transistor while the gate is grounded which causes the voltage threshold of the memory cell to decrease. To erase a memory cell, for example, the gate voltage of the transistor may be raised to a high voltage which causes the voltage threshold of the memory cell to increase. When a memory cell is erased, the voltage threshold may move to a lower value, and when the memory cell is programmed, the voltage threshold may move to a higher value. In two-level flash memories, for example, when in an erased state, the memory cell may have a relatively low voltage threshold and may be associated with a low logical value 0. In the programmed state, the memory cell may have a higher voltage threshold relative to the erased state and may be associated with a high logical value 1. In such example, to program or erase a cell, the voltage threshold of the gate of the MOSFET may be modified to switch between low logical value 0 corresponding to an erased state and a high logical value 1 corresponding to a programmed state. It should be understood, that in some examples, a low logical value 0 may correspond to a programmed state, and a high logical value 1 may correspond to an erased state.

In some embodiments, a read operation is performed to determine the state of a memory cell (e.g., whether erased or programmed). The information stored in the memory cell may be read to determine whether a memory cell is erased or programmed. In some examples, a read operation may include applying a reference voltage to the gate of the MOSFET and sensing a reference current. The memory cell may be determined to be erased if the MOSFET conducts current (e.g., based on the voltage threshold of the memory cell being greater than the voltage threshold of the reference voltage threshold), and determined to be programmed if the MOSFET does not conduct current (e.g., based on the voltage threshold of the memory cell being less than the voltage threshold of the reference voltage threshold). The reference voltage, for example, may be a value between the voltage threshold of an erased cell (e.g., erased memory cell) and a programmed cell (e.g., programmed memory cell).

Read circuitries may be leveraged to read the logical values stored in memory cells to determine the state of a memory cell (e.g., erased or programmed). The logical value stored in a memory cells may be read by comparing a current flowing through a memory cell with reference cells. A sense amplifier may be used to compare the current flowing through a memory cell and a reference cell. In some examples, a sense amplifier refers to an amplifier that is configured to sense low voltage signals from bit lines and amplify the small voltage swing to recognizable logic levels to enable data to properly read. The sense amplifier may be connected to bit lines of the memory cells and the reference cells.

As described above, there are many technical challenges and difficulties associated with read methodology for memory cells. Some of these technical challenges and difficulties include low reliability of read operation due to voltage shift and area impact, to name a few. In eMTP IPs, for example, a serial read methodology may be used to read data, where one bit is read at a time. In such examples, data from memory cells may be read using a differential methodology based on the comparison between memory cells and reference cells. The reference cells, for example, may share the gate voltage with a memory cell. In some examples, the voltage threshold of a reference cells may be a fixed value between voltage threshold of erased cell and voltage threshold of programmed cell. In some examples, the voltage threshold of a reference cell may be complementary to the voltage threshold of the memory cell. As a result, such differential read methodology generally require using at least two memory cells to store one bit of information, and thus results in inefficient area usage. For example, a considerable area in the memory device may utilized based on using at least two memory cells to store a single bit of information.

Where the reading operation of a memory cell, particularly two-level memory cell, is performed by comparing the cell current of the memory cell (e.g., current flowing through the memory cell) to a single reference current, aging effect, continuous cycling effect, exposure to stress effect, and/or the like may impact reliability of the read operation such that the state of the memory cell may not be accurately determined. For example, due to aging, exposure to stress, and/or continuous cycling with respect to memory cells, the voltage threshold of memory cells may gradual shift (e.g., the voltage threshold may gradually increase) causing the cell current to decrease, and ultimately impacting reliability of read operations, particularly in erased cells. For example, as the voltage threshold of an erased cell shifts (e.g., increases), it moves towards the voltage threshold of virgin cells, thus making it challenging to accurately distinguish between erased and programmed cell. For example, the voltage threshold of a particular erased cell may shift considerably to a value that falls within the voltage threshold distribution of a virgin cell and/or programmed cell, thus leading to inaccurate read operation. In this regard, it may be difficult and challenging to accurately determine whether a memory cell is under erased, over programmed, and/or the like due to shift in the voltage threshold of the memory cell.

Embodiments of the present disclosure address the above-mentioned challenges and difficulties, as well as other challenges and difficulties associated with read operations of a non-volatile memory device. Specifically, embodiments of the present disclosure adopt a single ended sense approach and compares a cell current to a plurality of reference currents to determine a granular state of the memory cell. For example, some embodiments utilize read a memory cell using a single-ended sense amplifier configured to compare the cell current of the memory cell to a plurality of carefully selected reference currents (e.g., predefined reference currents).

By comparing the cell current to a plurality of reference currents while employing a single-ended approach, embodiments of the present disclosure are able to distinguish between properly erased cells, under erased cells, poorly erased cells, and programmed cells. By comparing the cell current to a plurality of reference currents, embodiments of the present disclosure are able to capture, track, and/or monitor the voltage shift tendency of a memory cell over a period of time, thus allowing for corrective actions to be implemented. For example, embodiments, of the present disclosure may be configured to determine whether a memory cell is properly erased, under erased, poorly erased, or programmed, thus improving the reliability of read operations and able to determine aging effect, stress exposure effect, and/or continuous cycling effect on a memory cell at an early stage (e.g., when the voltage threshold of erased cell begins to shift towards the voltage threshold of virgin cell and/or programmed cells.

By comparing a memory cell (e.g., cell current thereof) to predefined reference currents (e.g., rather than reference cells), embodiments of the present disclosure efficiently utilize the area of the memory device. For example, embodiments of the present disclosure obviate the need to compare the memory cell to reference cells to read the memory cell. In this regard, embodiments of the present disclosure may reduce the array area, for example, by half as compared to the case where reference cells are utilized. Some embodiments of the present disclosure leverage a voltage shift distribution to select or otherwise determine the reference currents for comparing to the cell current of a memory such that voltage shift in memory cells may be detected early to allow for corrective action to be implemented (e.g., by a user).

FIG. 1. Illustrates an example memory cell voltage threshold distribution set 100 of a memory cell in accordance with at least one embodiment of the present disclosure. Specifically, FIG. 1, illustrates a non-volatile memory voltage threshold distribution set. As illustrated in the FIG. 1, the memory cell voltage threshold distribution set 100 may include an erased cell voltage threshold distribution 102 of a (e.g., voltage threshold distribution of erased memory cell), a virgin cell voltage threshold distribution 104 (e.g., voltage threshold distribution of virgin memory cell), and programmed cell voltage threshold distribution 106 (e.g., voltage threshold distribution of programmed memory cell).

As illustrated, the erased cell voltage threshold distribution 102 may define a minimum erased cell current 112 corresponding to the maximum voltage threshold represented in the erased cell voltage threshold distribution 102. As illustrated, the virgin cell voltage threshold distribution 104 may define a maximum virgin cell current 114 corresponding to the minimum virgin cell voltage threshold represented in the virgin cell voltage threshold distribution 104. As illustrated, the virgin cell voltage threshold distribution 104 may define a minimum virgin cell current 116 corresponding to the maximum virgin cell voltage threshold represented in the virgin cell voltage threshold distribution 104. In some embodiments, a virgin memory cell describes a memory cell that has not gone through any read operations, program operations, erase operations, and/or other operations associated with a memory cell. For example, a virgin cell may be a memory cell made with the same technology as the memory cell being read, but that has not gone through any read, program, or erase operations. For example, a virgin cell may include a memory cell as manufactured (e.g., directly out of the semiconductor fabrication).

The memory cell voltage threshold distribution set 100, for example may represent an ideal voltage threshold distribution in that there is adequate window (e.g., gap) between the individual voltage threshold distributions (e.g., between the erased cell voltage threshold distribution 102, virgin cell voltage threshold distribution 104, and programmed cell voltage threshold distribution 106). As can be seen from FIG. 1, a considerable voltage threshold shift of a particular erased cell may cause the voltage threshold of the particular erased cell to shift towards the virgin cell voltage threshold distribution 104 and/or the programmed cell voltage threshold distribution 106 such that the voltage threshold of the particular erased cell may not be distinguishable from a virgin cell and/or a programmed cell by comparing the cell current of the particular erased cell to a single reference current.

In some embodiments, the robust read methodology techniques of the present disclosure leverage the memory cell voltage threshold distribution set 100 to read a memory cell or otherwise determine the state of a memory cell. In some embodiments, to read a memory cell (e.g., determine the state of a memory cell), the cell current of the memory cell is compared to a plurality of reference currents (e.g., predefined reference currents) that are determined based on the memory cell voltage threshold distribution set 100 (e.g., based on one or more of the erased cell voltage threshold distribution 102, virgin cell voltage threshold distribution 104, and programmed cell voltage threshold distribution 106).

In some embodiments, the minimum erased cell current 112, based on the erased cell voltage threshold distribution 102, is selected as a first reference current (e.g., "Iref1 Vt") of the plurality of reference currents. In some embodiments, the maximum virgin cell current 114, based on the virgin cell voltage threshold distribution 104, is selected as a second reference current (e.g., "Iref2 Vt") of the plurality of reference currents. In some embodiments, the minimum virgin cell current 116, based on the virgin cell voltage threshold distribution 104, is selected as a third reference current of the plurality of reference currents. In this regard, the first reference current, second reference current, and third reference current are carefully selected to enable granular determination of the state of a memory cell (e.g., properly erase, under erase, poorly erased, programmed, and/or the like), thus enabling early detection of the effect of aging, continuous cycle, and/or exposure to stress reflected in the voltage threshold shift of a memory cell. In some embodiments, the memory cell voltage threshold distribution set 100 may be obtained from silicon data associated with the memory cell that is being read. The memory cell voltage threshold distribution set, for example, may be associated with the memory cell being read.

Figure 2:
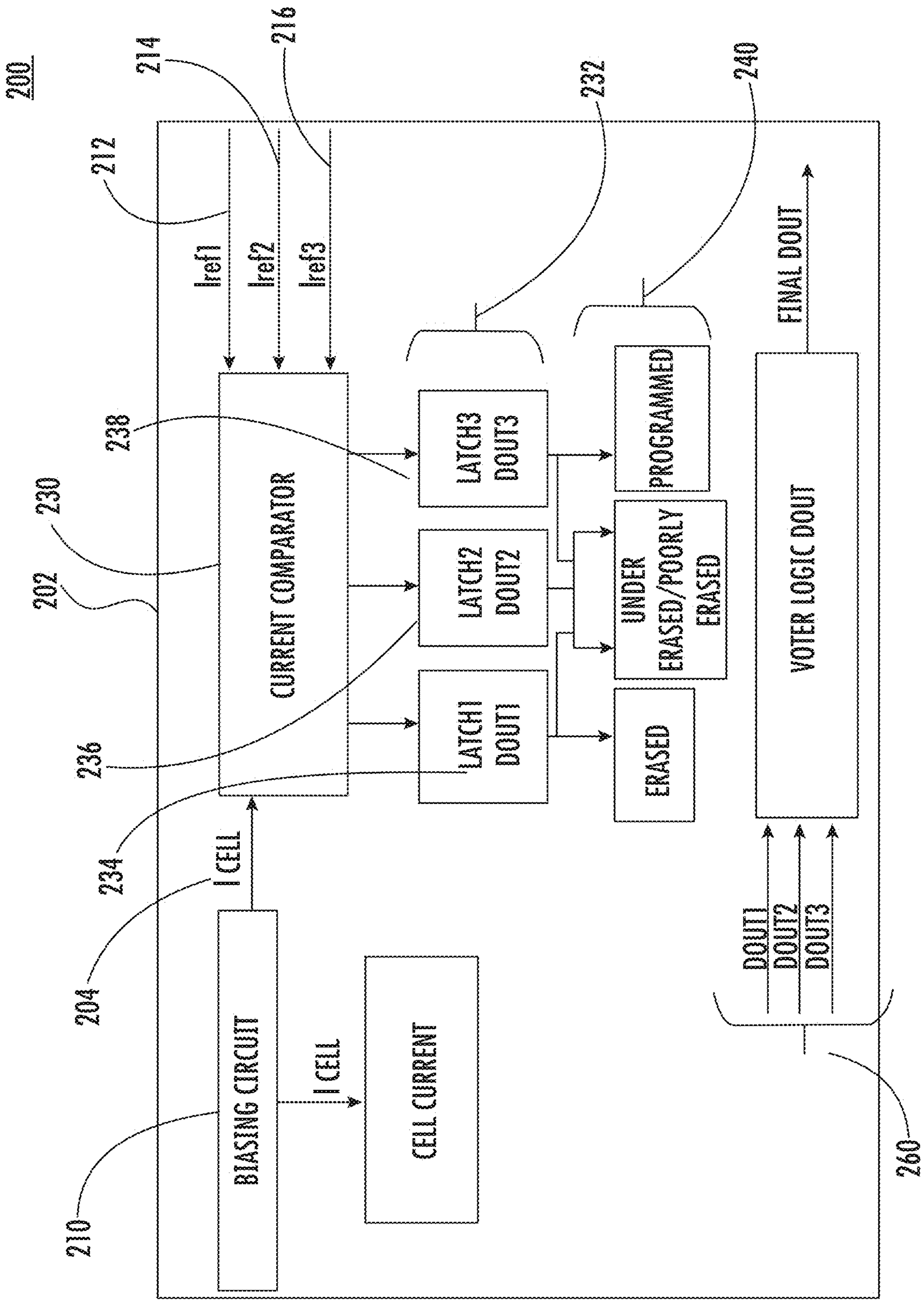
FIG. 2 provides a block diagram of an example robust read circuitry in accordance with at least one embodiment of the present disclosure.

FIG. 2, illustrates an example block diagram of a robust read circuitry 200 in accordance with at least one embodiment of the present disclosure. In some embodiments, the robust read circuitry embodies a sense amplifier 202 configured to compare a cell current 204 (e.g., "$I_{cell}$") to a plurality of reference currents. In some embodiments, the sense amplifier 202 is a single ended sense amplifier. In some embodiments, the plurality of reference currents includes a first reference current 212 corresponding to the minimum erased cell current 112, second reference current 214 corresponding to the maximum virgin cell current 114, and/or a third reference current 216 corresponding to the minimum virgin cell current 116.

In some embodiments, the sense amplifier 202 includes a biasing circuit 210, one or more current generators (not shown), a comparator 230, and a logic stage 240. The biasing circuit 210 may be configured to bias the memory cell to a desired voltage level before read operation is performed. For example, the biasing circuit may be configured to apply a fixed reference voltage to the gate of the memory cell (e.g., transistor thereof). In some embodiments, the reference voltage is selected to be between the erased cell voltage threshold distribution 102 and the programmed cell voltage threshold distribution 106. In some embodiments, the reference voltage is selected to be in the window between the virgin cell voltage threshold distribution 104 and the programmed cell voltage threshold distribution 106. In some embodiments, the memory cell embodies a complementary metal oxide semiconductor (CMOS)-based memory cell. For example, the memory cell may be implemented based on CMOS logic.

The one or more current generators may be configured to generate the first reference current 212, second reference current 214, and third reference current 216. In some embodiments, the one or more current generators may include a single current generator configured to output each of the first reference current 212, second reference current 214, and third reference current 216. In some embodiments, the one or more current generators may include a plurality of current generators, where each current generator is configured to output a particular reference current. For example, a first current generator may be configured to output the first reference current 212, a second current generator may be configured to output the second reference current 214, and a third current generator may be configured to output the third reference current 216.

In some embodiments, the comparator 230 is a current comparator. In some embodiments, the comparator 230 may be configured to receive the cell current 204 and the plurality of reference currents (e.g., first reference current 212, second reference current 214, and third reference current 216). In some embodiments, the comparator 230 includes an array-side input terminal that is configured to receive the cell current 204 and a plurality of reference-side input terminals configured to receive the plurality of reference currents (e.g., first reference current 212, second reference current 214, and third reference current 216).

The array-side input terminal may be selectively connected to the memory cell or otherwise the memory array associated with the memory cell, to receive the cell current 204. The reference-side input terminals may be coupled to the one or more current generators (not shown). For example, the reference-side input terminals may be configured to receive the first reference current 212, the second reference current 214, and the third reference current 216.

In some embodiments, the comparator 230 is configured to compare the cell current 204 to one or more of the first reference current 212, the second reference current 214, and the third reference current 216. In some embodiments, the comparator 230 is configured to compare the cell current 204 to each of the first reference current 212, the second reference current 214, and the third reference current 216. For example, the comparator 230 may be configured to compare the cell current 204 to the first reference current 212, compare the cell current 204 to the second reference current 214, and/or compare the cell current 204 to the third reference current 216.

In some embodiments, the comparator 230 may be configured to compare the cell current 204 to each of the first reference current 212, second reference current 214, and third reference current 216 simultaneously. In some embodiments, the comparator 230 may be configured to compare the cell current 204 to each of the first reference current 212, second reference current 214, and third reference current 216 sequentially.

In some embodiments, the comparator 230 includes a comparison output stage 232. In some embodiments, the comparison output stage 232 includes a plurality of comparison output terminals. The plurality of comparison output terminals, for example, may be latch output terminals. In some embodiments, the plurality of comparison output terminals of the comparison output stage 232 are configured to output the result of the comparison of the cell current 204 to a particular reference current of the plurality of reference currents (e.g., the first reference current 212, second reference current 214, or third reference current 216).

In some embodiments, the comparison output stage 232 includes a first comparison output terminal 234 configured to output a first comparison output signal that corresponds to the result of the comparison of the cell current 204 to the first reference current 212. In some embodiments, the comparison output stage 232 includes a second comparison output terminal 236 configured to output a second comparison output signal that corresponds to the result of the comparison of the cell current 204 to the second reference current 214. In some embodiments, the comparison output stage 232 includes a third comparison output terminal 238 configured to output a third comparison output signal that corresponds to the result of the comparison of the cell current 204 with the third reference current 216.

In some embodiments, the first comparison output terminal 234, second comparison output terminal 236, and third comparison output terminal 238 are configured to each output a high logical value 1 or a low logical value 0 corresponding to the result of the comparison between the cell current and respective reference current (e.g. one of the first reference current 212, the second reference current 214, or the third reference current 216). In some embodiments, the comparator 230 is configured to output at each of the comparison output terminals 234-238, a high logical value 1 if the respective reference current is greater than the cell current 204 (e.g., cell current 204 is less than the reference current), and output a low logical value 0 if the cell current 204 is greater than the reference current (e.g., reference current is less than the cell current 204).

It should be understood that in some embodiments, the comparator 230 may be configured to output at each of the comparison output terminals 234-238, a low logical value 0 if the respective reference current is greater than the cell current 204 (e.g., cell current 204 is less than the reference current), and output a high logical value 1 if the cell current 204 is greater than the reference current (e.g., reference current is less than the cell current 204).

In some embodiments, the logic stage 240 is configured to determine a granular state (e.g., properly erased, under erased, poorly erased, programmed cell, and/or the like) for the memory cell based on the results of the comparison of the cell current 204 to one or more of the plurality of reference currents.

In some embodiments, the sense amplifier 202 includes a second logic stage 260. The second logic stage 260 may be configured to process one or more of the comparison output signals (e.g., the first comparison output terminal 234, second comparison output terminal 236, and/or third comparison output terminal 238) from one or more of the first comparison output terminal 234, second comparison output terminal 236, and/or third comparison output terminal 238 to determine a primary state of the memory cell (e.g., the default states erased or programmed).

FIG. 3 illustrates an example output configuration of logic stage of the robust read circuitry in accordance with at least one embodiment of the present disclosure. In some embodiments, logic stage 240 is configured to determine a granular state of the memory cell based on one or more of the results of the comparisons of the cell current to a reference current. As described above, by leveraging three reference currents to read a memory cell, some embodiments are cable of determining granular states for a memory cell. For example, a first granular state may represent a good erase condition, a second granular state may indicate an under erased condition, a third granular state may indicate a poor erased condition, and a fourth granular state may indicate a programmed cell. In some embodiments, the granular state of the memory cell as determined by the robust read methodology techniques described herein may reflect the degree of voltage threshold shift of the memory cell.

As described above, with reference to FIG. 2, a sense amplifier 202 may be configured to sense or otherwise receive a cell current 204, and one or more of a first reference current 212, second reference current 214, and/or third reference current 216. For example, the comparator of the sense amplifier may be configured to receive the cell current 204, first reference current 212, second reference current 214, and third reference current 216.

The sense amplifier, using a comparator (e.g., comparator 230), may compare the cell current 204 with each of the first reference current 212, second reference current 214, and third reference current 216, and output a first comparison output signal 304 (e.g., "D0"), a second comparison output signal 306 (e.g., "D1"), and a third comparison output signal 308 (e.g., "D2"), where each of the comparison output signals 304-308 represent the result of comparison of the cell current 204 with a particular reference current (e.g., one of the first, second, and third reference currents 212-216).

In some embodiments, the comparator is configured to output a low logical value 0 if the cell current is determined to be greater than the reference current (e.g., one of the first, second, and third reference current), and output a high logical value 1 if the cell current is determined to be less than the reference current (e.g., one of the first, second, and third reference currents 212-216).

In some embodiments, a first granular state of the plurality of granular states describes a first condition 322 where the cell current 204 is greater than each of the first reference current 212, second reference current 214, and third reference current 216. In some embodiments, the first granular state indicates that the voltage threshold of the memory cell is less than the maximum erased cell voltage threshold of the erased cell voltage threshold distribution 102 (see e.g., FIG. 1), thus indicating the memory cell is properly erased (e.g., a good erase condition). In some embodiments, the first condition 322 indicates the absence of a voltage threshold shift or minimal voltage threshold shift. Alternatively or additionally, in some embodiments, the first condition 322 indicates minimal or absence of aging effect and/or continuous cycling effect.

As illustrated in FIG. 3, in some embodiments, when the cell current is properly erased (e.g., associated with a good erase condition), the first comparison output signal 304 corresponding to a comparison between the cell current 204 and the first reference current 212 may be a low logical value 0 based on the memory cell having a cell current 204 that is greater than the first reference current 212. Alternatively or additionally, the second comparison output signal 306 corresponding to a comparison between the cell current 204 and the second reference current 214 may be a low logical value 0 based on the memory cell having a cell current 204 that is greater than the second reference current 214. Alternatively or additionally, the third comparison output signal 308 corresponding to a comparison between the cell current and the third reference current may be a low logical value 0 based on the memory cell having a cell current 204 that is greater than the third reference current 216.

In some embodiments, a second granular state of the plurality of granular states describes a second condition 324 where the cell current 204 is greater than the second reference current 214, and the first reference current 212 is greater than the cell current 204. In some embodiments, the second granular state indicates that the voltage threshold of the memory cell is between the maximum erase voltage threshold and minimum virgin voltage threshold of the virgin cell voltage threshold distribution 104 (See e.g., FIG. 1) (e.g., the window between the erased cell voltage threshold distribution and the virgin cell voltage threshold distribution 104), thus indicating that the memory cell is under erased. In this regard, the second granular state may indicate some degree of voltage shift. Alternatively or additionally, the second granular state may indicate some aging and/or continuous cycle effect.

As illustrated, in some embodiments, when the memory cell is under erased, the first comparison output signal 304 may be a high logical value 1 based on the memory cell having a cell current 204 that is less than the first reference current 212. Alternatively or additionally, the second comparison output signal 306 may be a low logical value 0 based on the memory cell having a cell current 204 that is greater than the second reference current 214. Alternatively or additionally, the third comparison output signal 308 may be a low logical value 0 based on the memory cell having a cell current 204 that is greater than the third reference current 216.

In some embodiments, a third granular state of the plurality of granular states describes a third condition 326 where the cell current 204 is greater than the third reference current 216 but less than the first reference current 212 and the second reference current 214. In some embodiments, the third granular state indicates that the voltage threshold of the memory cell is between the minimum virgin voltage threshold and the maximum virgin voltage threshold of the virgin cell voltage threshold distribution 104 (See e.g., FIG. 1), thus indicating that the memory cell is poorly erased (e.g., poor erase condition). In this regard, the third granular state may indicate a considerable degree of voltage shift, where the voltage threshold of the cell may be within the voltage threshold distribution of the virgin cell, indicating potential reliability issues. Alternatively or additionally, the third granular state may indicate a considerable aging and/or continuous cycle effect.

As illustrated, in some embodiments, when the memory cell is poorly erased (e.g., poor erase condition), the first comparison output signal 304 may be a high logical value 1 based on the memory cell having a cell current 204 that is less than the first reference current 212. Alternatively or additionally, the second comparison output signal 306 may be a high logical value 1 based on the memory cell having a cell current 204 that is less than the second reference current 214. Alternatively or additionally, the third comparison output signal 308 may be a low logical value 0 based on the memory cell having a cell current 204 that is greater than the third reference current 216.

In some embodiments, a fourth granular state of the plurality of granular states describes a fourth condition 328 where the cell current 204 is less than each of the first reference current 212, the second reference current 214, and the third reference current 216 (e.g., the third reference current is greater than the cell current). In some embodiments, the fourth granular state indicates that the voltage threshold of the memory cell is greater than the maximum voltage threshold of the virgin cell, thus indicating a programmed cell.

As illustrated, in some embodiments, when the memory cell is programmed (e.g., programmed cell), the first comparison output signal 304 may be a high logical value 1 based on the memory cell having a cell current 204 that is less than the first reference current 212. Alternatively or additionally, the second comparison output signal 306 may be a high logical value 1 based on the memory cell having a cell current 204 that is less than the second reference current 214. Alternatively or additionally, the third comparison output signal 308 may be a high logical value of 1 based on the memory cell having a cell current 204 that is less than the third reference current 216.

It would be appreciated that in some embodiments, the logical values associated with the output signals may be reversed. For example, in some embodiments, the output signal may be a high logical value 1 if the cell current is greater than the reference current, and a low logical value 0 if the cell current is less than the reference current.

In some embodiments, the robust read circuitry 200 (e.g., sense amplifier 202 thereof) may be configured to output to, for example, a user, the first comparison output signal 304, the second comparison output signal 306, and/or the third comparison output signal 308 corresponding to the granular state determined by the robust read circuitry (e.g., sense amplifier 202 thereof).

As illustrated in FIG. 3, in some embodiments, alternatively or additionally, the robust read circuitry 200 (e.g., sense amplifier 202 thereof) may configured to output a primary output signal 310 that indicates an erased state or a programmed state. In some embodiments, the primary output signal 310 is determined based on the first comparison output signal 304, the second comparison output signal 306, and/or the third comparison output signal 308. In some embodiments and as illustrated in FIG. 3, the robust read circuitry 200 (e.g., sense amplifier 202 thereof) outputs a low logical value 0 corresponding to an erased state for each of the first condition 322 (e.g., properly erased state), second condition 324 (e.g., under erased state), and third condition 326 (e.g., poorly erased state). In some embodiments and as illustrated in FIG. 3, the robust read circuitry 200 (e.g., sense amplifier 202 thereof) outputs a high logical value 1 corresponding to a programmed state for the fourth condition 328 (e.g., programmed cell).

It should be understood, that in some embodiments, the logical states may be reversed. For example, the robust read circuitry 200 (e.g., sense amplifier 202 thereof) may output a high logical value 1 corresponding to an erased state for each of the first condition 322 (e.g., properly erased state), second condition 324 (e.g., under erased state), and third condition 326 (e.g., poorly erased state), and output a low logical value 0 corresponding to a programmed state for the fourth condition 328 (e.g., programmed cell).

Figure 4:
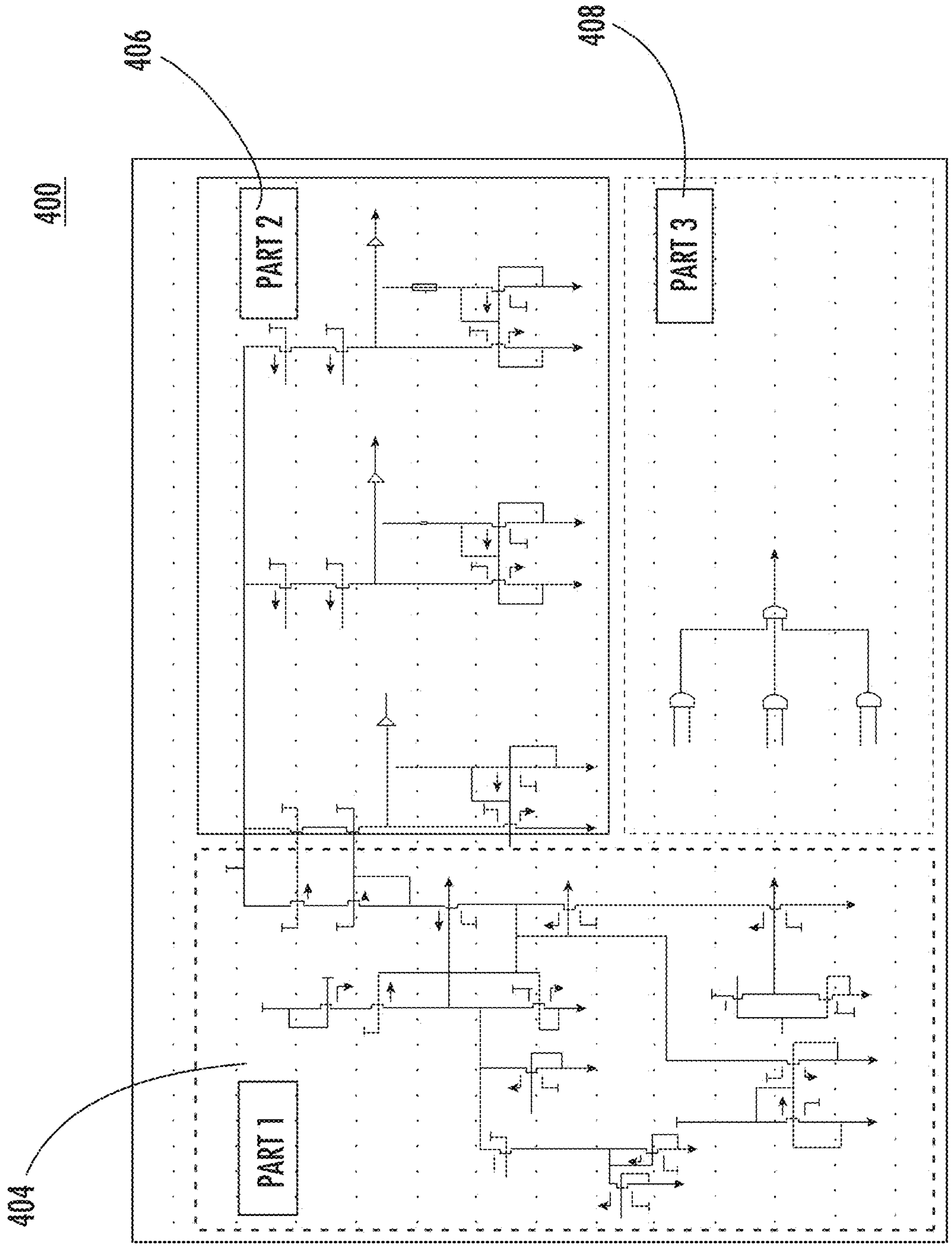
FIG. 4 provides a schematic diagram of an example sense amplifier in accordance with at least one embodiment of the present disclosure.

FIG. 4 provides a schematic diagram of an example sense amplifier 400 in accordance with at least one embodiment of the present disclosure. Sense amplifier 400 may be an example of sense amplifier 202 discussed with reference to FIG. 2. Specifically FIG. 4 illustrates a schematic diagram of a single ended sense amplifier. FIG. 4 depicts a first part 404 of the sense amplifier 400 configured to be utilized for biasing of the bit line (e.g., during pre-charge phase). As depicted, a second part 406 may be configured to be utilized for comparing the cell current to the plurality of reference currents (e.g., during evaluation phase). As further depicted in FIG. 4, a third part 408 is configured to be utilized to generate the primary output signal (erased state or programmed state). In this regard, by utilizing a single ended sense amplifier configured to compare the cell current of a memory cell to each of a plurality of reference currents, embodiments of the present disclosure reduce the array cell area utilized by obviating the need to use reference cells (e.g., saves the area that may otherwise include reference cells).

Figure 5:
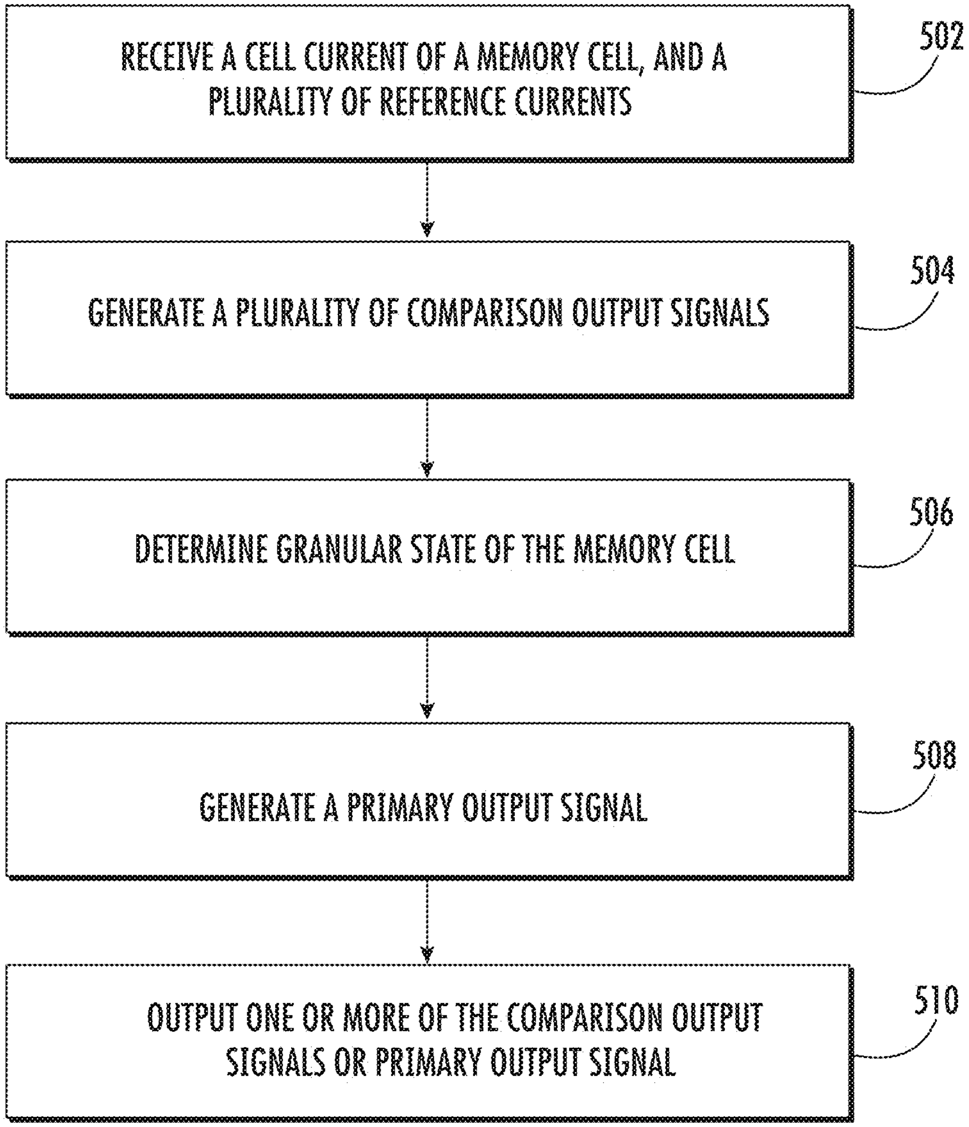
FIG. 5 provides a flow chart depicting operations of an example process for reading a non-volatile memory in accordance with at least on embodiment of the present disclosure.

FIG. 5 illustrates a flow chart depicting operations of an example method/process of a robust read methodology technique according to at least one embodiment of the present disclosure. It will be appreciated that each of the flowcharts depicts an example computer-implemented method/process that is performable by one or more of the apparatuses, systems, devices, and/or computer program products, for example utilizing one or more of the specially configured components thereof.

Although the example method/process depict a particular sequence of operations, the sequence may be altered without departing from the scope of the present disclosure. For example, some of the operations depicted may be performed in parallel or in a different sequence that does not materially affect the function of the processes.

The blocks indicate operations of the method/process. Such operations may be performed in any of a number of ways, including, without limitation, in the order and manner as depicted and described herein. In some embodiments, one or more blocks of any of the processes described herein occur in-between one or more blocks of another process, before one or more blocks of another process, in parallel with one or more blocks of another process, and/or as a sub-process of a second process. Additionally or alternatively, any of the processes in various embodiments include some or all operational steps described and/or depicted, including one or more optional blocks in some embodiments. With regard to the flowcharts illustrated herein, one or more of the depicted block(s) in some embodiments is/are optional in some, or all, embodiments of the disclosure. Optional blocks are depicted with broken (or "dashed") lines. Similarly, it should be appreciated that one or more of the operations of each flowchart may be combinable, replaceable, and/or otherwise altered as described herein.

According to some examples, the method includes receiving a cell current of a memory cell, and a plurality of reference currents at operation 502. For example, the example method includes sensing the cell current, a first reference current, a second reference current, and/or a third reference current utilizing a sense amplifier. In some embodiments, the sense amplifier is a single ended sense amplifier. In some embodiments, the cell current and/or the plurality of reference currents may be sensed in response to an indication of a read operation. In some embodiments, the bit line associated with the memory cell is biased to provide a reference voltage applied to the gate of the memory cell. In some embodiments, the memory cell is a non-volatile memory cell. Alternatively or additionally, in some embodiments, the memory cell is a two-level memory cell that is electrically programmable and erasable. Alternatively or additionally, the memory cell is a multi-time programmable (MTP) memory. For example, the memory cell may embody an eMTP IP. Alternatively or additionally, in some embodiments, the memory cell is a CMOS-based memory cell. For example, the memory cell may embody a CMOS configuration. For example, the memory cell may be implemented based on CMOS logic such that additional mask may not be required.

In some embodiments, the plurality of reference currents includes a first reference current, a second reference current, and a third reference current. In some embodiments, the first, second, and third reference currents are determined based on a voltage threshold distribution associated with the memory cell. In some embodiments, the first reference current corresponds to a minimum erased cell current based on the voltage threshold distribution associated with the memory cell. In some embodiments, the second reference current corresponds to a maximum virgin cell current based on the voltage threshold distribution associated with the memory cell. In some embodiments, the third reference current corresponds to a minimum virgin cell current based on the voltage threshold distribution associated with the memory cell.

According to some examples, the method includes generating a plurality of comparison output signals at operation 504. In some embodiments, a first comparison output signal is generated based on comparing the cell current to the first reference current. In some embodiments, a second comparison output signal is generated based on a comparing the cell current to the second reference current. In some embodiments, a third comparison output signal is generated based on comparing the cell current to the third reference current.

According to some examples, the method includes determining a granular state of the memory cell at operation 506. For example, the example method includes determining a granular state of a plurality of granular states for the memory cell based on one or more of the comparison of the cell current to the first reference current, the comparison of the cell current to the second reference current, or comparison of the cell current to the third reference current.

In some embodiments the granular state of the memory cell is determined based on comparing the cell current to at least two of the plurality of reference currents. In some embodiments the granular state of the memory cell is determined based on each of the comparison of the cell current to the first reference current, the comparison of the cell current to the second reference current, and the comparison of the cell current to the third reference current.

In some embodiments, the plurality of granular states includes one or more of a properly erased state, an under erased state, a poorly erased state, or a programmed state. In some embodiments, the memory cell is determined to be properly erased if the cell current is determined to be greater than the first reference current. In some embodiments, the memory cell is determined to be under erased if the cell current is greater than the second reference current, and the first reference current is greater than the cell current. In some embodiments, the memory cell is determined to be poorly erased if the cell current is greater than the third reference current, and each of the first reference current and the second reference current are greater than the cell current. In some embodiments, the memory cell is determined to be programmed if the cell current is less than each of the first reference current, the second reference current, and the third reference current.

According to some examples, the method includes generating a final output signal corresponding to a primary state of the memory cell at operation 508. In some embodiments, the example method includes generating the final output signal based on one or more of the first comparison output signal, the second comparison output signal, or the third comparison output signal. In some embodiments, generating the final output may include performing one or more logical operations with respect to one or more of the first comparison output signal, the second comparison output signal, or the third comparison output signal. In some embodiments, the final output signal is generated based on each of the first comparison output signal, the second comparison output signal, and the third comparison output signal.

According to some examples, the method includes outputting one or more of the first comparison output signal, the second comparison output signal, the third comparison output signal, or the primary output signal at operation 510. For example, the first comparison output signal, the second comparison output signal, the third comparison output signal, and the final output signal may be outputted such that it is accessible to a user.

CONCLUSION

Many modifications and other embodiments of the disclosure set forth herein will come to mind to one skilled in the art to which this disclosure pertains having the benefit of the teachings presented in the foregoing description and the associated drawings. Therefore, it is to be understood that the embodiments are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

While this specification contains many specific implementation details, these should not be construed as limitations on the scope of any disclosures or of what may be claimed, but rather as descriptions of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

Further, while this detailed description has set forth some embodiments of the present disclosure, the appended claims may cover other embodiments of the present disclosure which differ from the described embodiments according to various modifications and improvements. For example, in some embodiments, a high logical value 1 may be associated with an erased cell and a low logical value 0 may be associated with a programmed cell. As another example, in some embodiments, the plurality of references may include less than three references or more than three references. As yet another example, in some embodiments, the plurality references may be selected based on other criteria that may not be based on the voltage threshold distribution. As yet another example, the sense amplifier may embody a different configuration without departing from the scope of the present disclosure.

Further, within the appended claims, unless the specific terms "means for" or "step for" is used within a given claim, it is not intended that the claim be interpreted under 35 U.S.C. § 112, paragraph (f).

The invention claimed is:

1. A method for reading a memory cell, the method comprising:
- receiving a cell current of a memory cell;
- receiving a first reference current, a second reference current, and a third reference current, wherein the first reference current corresponds to a minimum erased cell current based on a voltage threshold distribution associated with the memory cell, and wherein the second reference current corresponds to a maximum virgin cell current based on the voltage threshold distribution associated with the memory cell;
- generating a first comparison output signal based on comparing the cell current to the first reference current;
- generating a second comparison output signal based on comparing the cell current to the second reference current;
- generating a third comparison output signal based on comparing the cell current to the third reference current; and
- determining a granular state of the memory cell based at least in part on one or more of the comparison of the cell current to the first reference current, the comparison of the cell current to the second reference current, or the comparison of the cell current to the third reference current.

2. The method of claim 1, wherein the third reference current corresponds to a minimum virgin cell current based on the voltage threshold distribution associated with the memory cell.

3. The method of claim 2, wherein the memory cell is determined to be properly erased if the cell current is determined to be greater than the first reference current.

4. The method of claim 2, wherein the memory cell is determined to be under erased if the cell current is greater than the second reference current, and the first reference current is greater than the cell current.

5. The method of claim 2, wherein the memory cell is determined to be poorly erased if the cell current is greater than the third reference current, and each of the first reference current and the second reference current are greater than the cell current.

6. The method of claim 2, wherein the memory cell is determined to be programmed if the cell current is less than each of the first reference current, the second reference current, and the third reference current.

7. The method of claim 1, further comprising generating a final output signal corresponding to a primary state of the memory cell based on one or more of the first comparison output signal, the second comparison output signal, or the third comparison output signal.

8. The method of claim 7, further comprising outputting one or more of the first comparison output signal, the second comparison output signal, the third comparison output signal, or the final output signal.

9. A robust read circuitry for reading a memory cell, the robust read circuitry comprising:
- a sense amplifier comprising:
  - one or more current generators configured to generate a plurality of reference currents, wherein the plurality of reference currents comprises a first reference current corresponding to a minimum erased cell current based on a voltage threshold distribution associated with the memory cell, a second reference current corresponding to a maximum virgin cell current based on the voltage threshold distribution associated with the memory cell, and a third reference current corresponding to a minimum virgin cell current based on the voltage threshold distribution associated with the memory cell; and
  - a comparator coupled to the one or more current generators, wherein the comparator is configured to:
    - receive a cell current of a memory cell;
    - receive the plurality of reference currents; and
    - determine a granular state of the memory cell based on comparing the cell current to at least two of the plurality of reference currents.

10. The robust read circuitry of claim 9, wherein the sense amplifier is configured to determine that the memory cell is properly erased if the cell current is determined to be greater than the first reference current.

11. The robust read circuitry of claim 9, wherein the sense amplifier is configured to determine that the memory cell is under erased if the cell current is determined to be greater than the second reference current, and the first reference current is determined to be greater than the cell current.

12. The robust read circuitry of claim 9, wherein the sense amplifier is configured to determine that the memory cell is poorly erased if the cell current is determined to be greater than the third reference current, and each of the first reference current and the second reference current are determined to be greater than the cell current.

13. The robust read circuitry of claim 9, wherein the sense amplifier is configured to determine that the memory cell is programmed if the cell current is determined to be less than the first reference current, the second reference current, and the third reference current.

14. The robust read circuitry of claim 9, further configured to output a primary state of the memory cell.

15. The robust read circuitry of claim 9, wherein the sense amplifier is a single ended sense amplifier.

16. The robust read circuitry of claim 9, wherein the memory cell is a two-level memory cell that is electrically programmable and erasable.

17. The robust read circuitry of claim 9, wherein the sense amplifier further comprises a biasing circuit configured to bias a bit line associated with a memory cell.

* * * * *